(12) United States Patent
Tsai et al.

(10) Patent No.: US 6,772,512 B2
(45) Date of Patent: Aug. 10, 2004

(54) METHOD OF FABRICATING A FLIP-CHIP BALL-GRID-ARRAY PACKAGE WITHOUT CAUSING MOLD FLASH

(75) Inventors: Ying-Chou Tsai, Hsinchu (TW); Jen-Yi Tsai, Chiayi (TW)

(73) Assignee: Siliconware Precision Industries Co., Ltd., Taiwan (TW)

( * ) Notice: Subject to any disclaimer, the term of this patent is extended or adjusted under 35 U.S.C. 154(b) by 0 days.

(21) Appl. No.: 09/760,439

(22) Filed: Jan. 13, 2001

(65) Prior Publication Data

US 2002/0092162 A1 Jul. 18, 2002

(51) Int. Cl.[7] .............................................. H05K 3/34
(52) U.S. Cl. ............................. 29/840; 29/832; 29/834; 29/841; 29/847; 29/848; 29/851; 156/245; 156/252; 156/256; 156/257; 156/295; 228/180.22; 228/215; 228/246; 264/155; 264/272.11; 264/271.1
(58) Field of Search ........................... 29/832, 834, 840, 29/841, 847, 848, 851; 228/180.22, 215, 246; 264/185, 272.11, 279.1; 156/245, 295, 252, 256, 257

(56) References Cited

U.S. PATENT DOCUMENTS

| | | | | |
|---|---|---|---|---|
| 5,612,576 A | * | 3/1997 | Wilson et al. ............... | 257/787 |
| 5,981,312 A | * | 11/1999 | Farquhar et al. ............ | 438/112 |
| 6,038,136 A | | 3/2000 | Chou .......................... | 361/783 |
| 6,054,755 A | * | 4/2000 | Takamichi et al. .......... | 257/667 |
| 6,324,069 B1 | * | 11/2001 | Weber ......................... | 174/260 |

* cited by examiner

Primary Examiner—Peter Vo
Assistant Examiner—Donghai D Nguyen
(74) Attorney, Agent, or Firm—Peter F. Corless; Steven M. Jensen; Edwards & Angell, LLP

(57) ABSTRACT

A method of fabricating a FCBGA (Flip-Chip Ball-Grid-Array) package without causing mold flash is proposed, which is characterized by the forming of a dummy pad over the back surface of the substrate to allow the portion of the solder mask formed over a vent hole in the substrate to be substantially raised to an elevated flat surface where a groove is then formed to surround the exit of the vent hole. During a molding process, when the encapsulation material infiltrates to the exit of the vent hole, it can be confined within the groove in the elevated flat surface over the dummy pad, thereby preventing it from flashing to nearby solder-ball pads. Since there would substantially exist no mold flash over the exposed surface of the solder mask and the solder-ball pads, the proposed method allows the resulting FCBGA package to be assured in the quality of its outer appearance and the quality of the electrical bonding between the solder-ball pads and the subsequently attached solder balls thereon to make the encapsulated semiconductor chip reliable to use during operation.

6 Claims, 7 Drawing Sheets

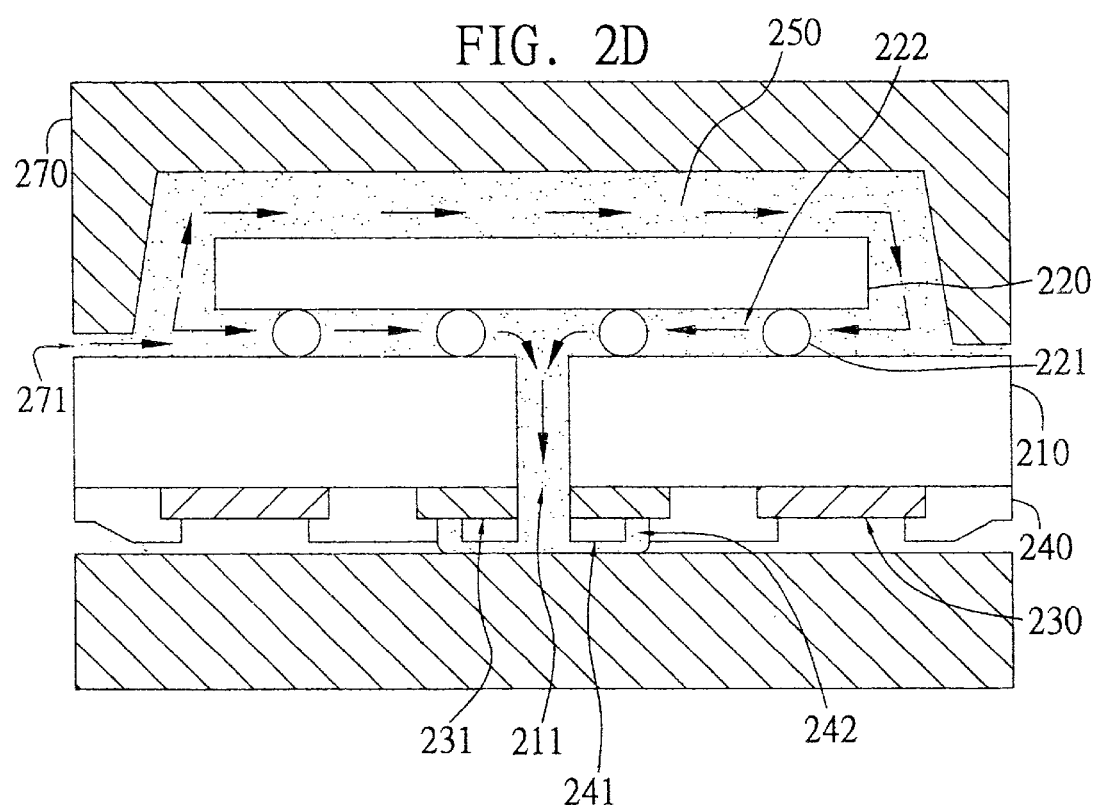

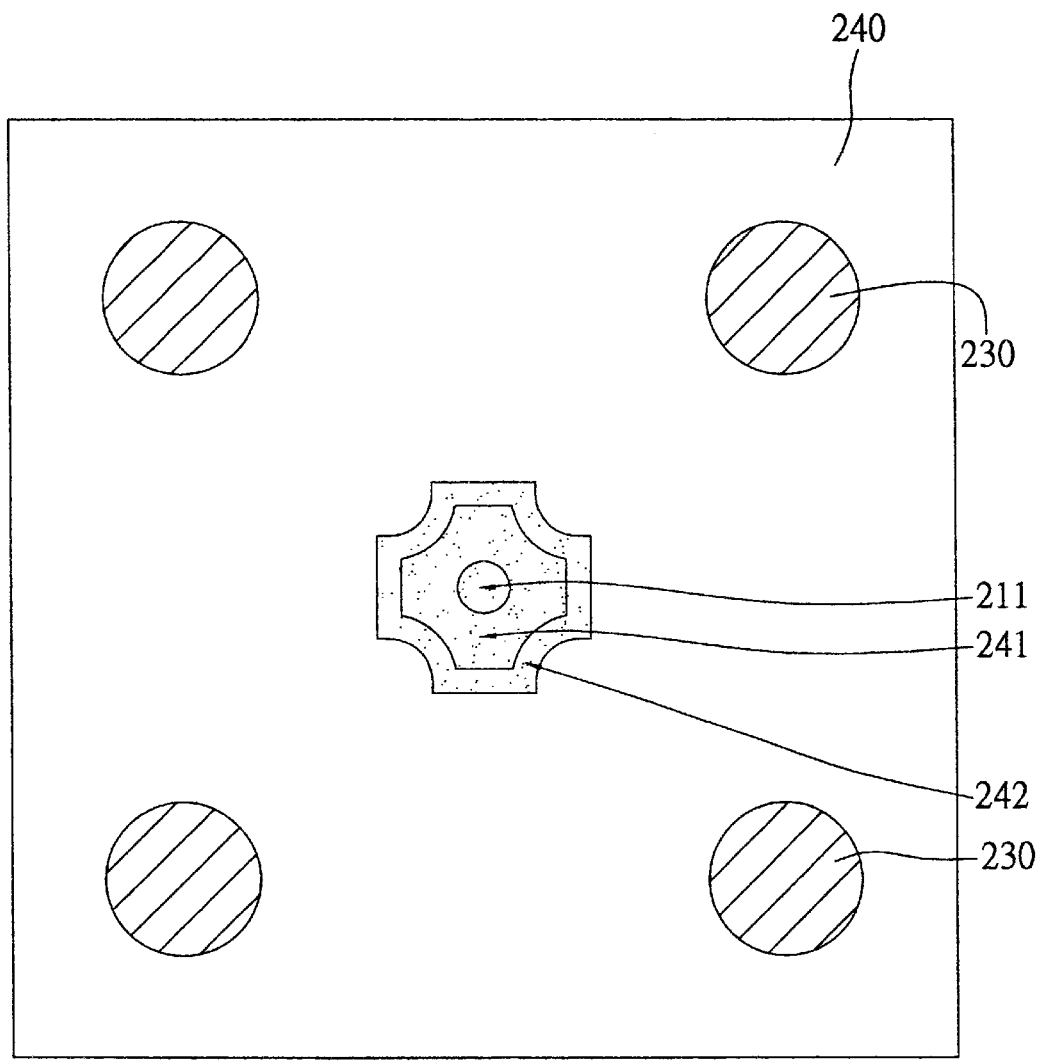

METHOD OF FABRICATING A FLIP-CHIP BALL-GRID-ARRAY PACKAGE WITHOUT CAUSING MOLD FLASH

BACKGROUND OF THE INVENTION

1. Field of the Invention

This invention relates to integrated circuit packaging technology, and more particularly, to a method of fabricating a FCBGA (Flip-Chip Ball-Grid-Array, or called Flip-Chip Chip-Scale-Package, FCCSP) package without causing mold flash.

2. Description of Related Art

BGA (Ball Grid Array) is an advanced type of integrated circuit packing technology which is characterized by the use of a substrate whose front side is mounted with a semiconductor chip and whose back side is mounted with a grid array of solder balls. During SMT (Surface Mount Technology) process, the BGA package can be mechanically bonded and electrically coupled to a printed circuit board (PCB) by means of these solder balls.

FCBGA (Flip-Chip Ball-Grid-Array) is a more advanced type of BGA technology which is characterized by a semiconductor chip mounted in an upside-down (i.e. flip chip) manner over the substrate and bonded to the same by means of a plurality of solder bumps attached to the I/O pads thereon. Since no bonding wires are required, the FCBGA package can be made very small in size to the chip scale. For this reason, it is also referred to as Flip-Chip Chip-Scale-Package (FCCSP) technology.

As the flip chip is readily bonded in position over the substrate, however, an undergap would be undesirably left between the flip chip and the substrate. If this flip-chip undergap is not underfilled, it would easily cause the flip chip to suffer from fatigue cracking and electrical failure due to thermal stress when the entire package structure is being subjected to high-temperature conditions. As a solution to this problem it is an essential step in flip-chip package fabrication to fill up the flip-chip undergap with an electrically-insulative material into the flip-chip undergap. The underfilled material, when hardened, can serve as a mechanical reinforcement for the flip chip to cope against thermal stress.

Conventionally, there are many methods that can be used to perform the above-mentioned flip-chip underfill process. One method is the molded-underfill process, which can fill the flip-chip undergap incidentally through the molding process to fabricate the required encapsulation body (or called molded compound). One example of the molded-underfill process is depicted in the following with reference to FIGS. 1A–1D (note that FIGS. 1A–1D are simplified schematic diagrams showing only the pats related to the invention; the actual layout on the FCBGA package may be much more complex).

FIG. 1A is a schematic sectional diagram showing a semi-finished FCBGA package assembly before molding. As shown, the semi-finished FCBGA package assembly includes: (a) a substrate 110 having a front surface 110a and a back surface 110b; (b) a semiconductor chip 120 mounted in an upside-down (i.e., flip chip) manner by means of a plurality of solder bumps 121 over the front surface 110a of the substrate 110; (c) an array of solder-ball pads 130 formed over the back surface 110b of the substrate 110, which are used for subsequent attachment of an array of solder balls (shown in FIG. 1D with the reference numeral 160) thereon; and (d) a solder mask 140 which covers all the back surface 110b of the substrate 110 while exposing the solder-ball pads 130.

One drawback to the conventional solder-mask fabrication process, however, is that it would make the resulted solder mask 140 to include a bulged portion 140a over the rim of the solder-ball pads 130 and a recessed portion 140b over other areas. The depth of the recessed portion 140b (i.e., the distance between the topmost surface of the bulged portion 140a and the bottom most surface of the recessed portion 140b) is typically 10 μm (micrometer).

As the semiconductor chip 120 is readily mounted in position over the substrate 110, however, a flip-chip undergap 120a would be undesirably left between the semiconductor chip 120 and the substrate 110. If this flip-chip undergap 120a is not underfilled, it would easily cause the semiconductor chip 120 to suffer from fatigue cracking and electrical failure due to thermal stress when the entire package structure is being subjected to high temperature conditions. One solution to this problem is molded-underfill.

To facilitate the molded-underfill process, it is required to drill a vent hole 111 through the substrate 110 and the solder mask 140 at the central point of the area where the semiconductor chip 120 is mounted. The vent hole 111 has an entrance in the front surface 110a of the substrate 110 and an exit in the recessed portion 140b of the solder mask 140.

Referring further to FIG. 1B, in the next step, a molding process is performed by fixing the semi-finished FCBGA package assembly in a molding tool 170 having an injection inlet 171; and then, an encapsulation material, such as epoxy resin, is injected through the injection inlet 171 into the molding tool 170 to thereby form a molded compound, or called encapsulation body 150, to encapsulate the semiconductor chip 120.

During the forgoing molding process, the encapsulation material will also infiltrate into the flip-chip undergap 120a. Owing to the provision of the vent hole 111, the air in the flip-chip undergap 120a can escape to the outside atmosphere, thus allowing the encapsulation material to infiltrate without air resistance into the entire flip-chip undergap 120a and thereby form a molded underfill layer 122 between the semiconductor chip 120 and the substrate 110.

One problem to the foregoing molded-underfill process, however, is that the encapsulation material would fisher infiltrate all the way through the vent hole 111 to the recessed portion 140b of the solder mask 140 (the marching path is indicated by the arrows in FIG. 1B); and after filling up the recessed portion 140b of the solder mask 140, the encapsulation material would further infiltrate tough the seam between the molding tool 170 and the bulged portion 140a of the solder mask 140 to the nearby solder-ball pads 130, thus causing mold flash 151 over the solder-ball pads 130.

As illustrated in FIG. 1C, since the encapsulation material is electrically-insulative, the mold flash 151 over the solder mask 140 and the solder-ball pads 130 would degrade the quality of the outer appearance of the resulted package.

Referring further to FIG. 1D, in the next step, a ball grid array 160, i.e., an area of solder balls, are attached to the solder-ball pads 130. Since mold flash 151 is left over the solder-ball pads 130, it would degrade the electrical bonding between the solder-ball pads 130 and the ball grid array 160, thus adversely affecting the reliability of the operation of the encapsulated semiconductor chip 120.

Related patents, include, for example, the U.S. Pat. No. 6,038,136 entitled "CHIP PACKAGE WITH MOLDED UNDERFILL". This patent discloses a FCBGA package tat is underfilled through molded underfill process. The utilization of this patent, however, still has the above-mentioned problem of mold flash.

SUMMARY OF THE INVENTION

It is therefore an objective of this invention to provide a method for fabricating a FCBGA package with molded underfill, which can help to prevent mold flash over exposed surface of the resulted package through the vent hole, so as to assure the quality of the outer appearance of the resulted package.

It is another objective of this invention to provide a method for fabricating a FCBGA package with molded underfill, which can help to prevent mold flashover exposed surface of the resulted package, so as to assure the quality of the bonding between the solder-ball pads and the solder balls attached thereon.

In accordance with the foregoing and other objectives, the invention proposes an improved method for fabricating a FCBGA package.

Broadly recited, the method of the invention comprises the following steps. (1) preparing a substrate having a front surface and a back surface; the substrate being predefined with a vent-hole position at a specified location; (2) forming a plurality of solder-ball pads and a dummy pad over the back surface of the substrate, the dummy pad being located at the predefined vent-hole position; (3) forming a solder mask over the back surface of the substrate to cover all the back surface of the substrate including the dummy pad while exposing the solder-ball pads; wherein the portion of the solder mask that is laid over the dummy pad is allowed to be formed into an elevated flat surface; (4) drilling through the predefined vent-hole position to thereby form a vent hole having an entrance in the front surface of the substrate and an exit in the elevated flat surface of the solder mask; (5) forming a groove in the elevated flat surface and surrounding the exit of the vent hole, (6) mounting a flip chip over the front surface of the substrate, wherein a flip-chip undergap is left between the flip chip and the substrate; and (7) performing a molding process to form an encapsulation body through the use of an encapsulation material to encapsulate the flip chip; wherein the vent hole allows the air in the flip-chip undergap to escape t outside atmosphere, thereby allowing the encapsulation material to infiltrate with air resistance into the flip-chip undergap and form a molded-underfill layer; and wherein as the encapsulation material flows to the exit of the vent hole and infiltrates to the groove, the encapsulation material would be contained within the groove, thereby preventing the encapsulation material from flashing to the solder-ball, pads.

Since there would substantially exist no mold flash over the exposed surface of the solder mask and the solder-ball pads, the invention allows the resulted FCBGA package to be assured in the quality of its outer appearance and the quality of the electrical bonding between the solder-ball pads and the subsequently attached solder balls thereon to make the encapsulated semiconductor chip reliable to use during operation.

BRIEF DESCRIPTION OF DRAWINGS

The invention can be more fully understood by reading the flowing detailed description of the preferred embodiments, with reference made to the accompanying drawings, wherein:

FIG. 2D is a schematic sectional diagram showing the semi-finished FCBGA package assembly of FIG. 2B while undergoing a molding process;

FIG. 2E shows a bottom view of the FCBGA package assembly after molding;

DETAILED DESCRIPTION OF PREFERRED EMBODIMENTS

The method according to the invention for fabricating a FCBGA package without mold flash is disclosed in full details in the following with reference to FIGS. 2A–2F.

Figure 1A:
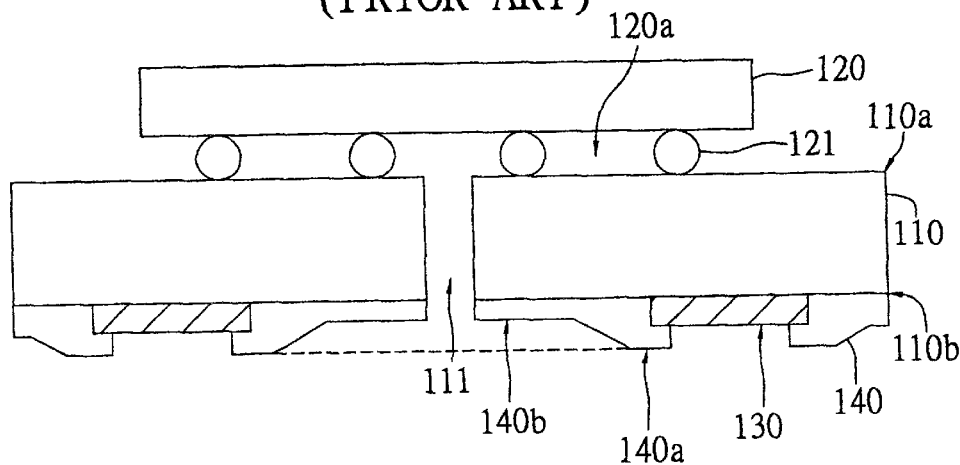
FIG. 1A (PRIOR ART) is a schematic sectional diagram showing a semi-finished FCBGA package assembly before molding.
Figure 1B:
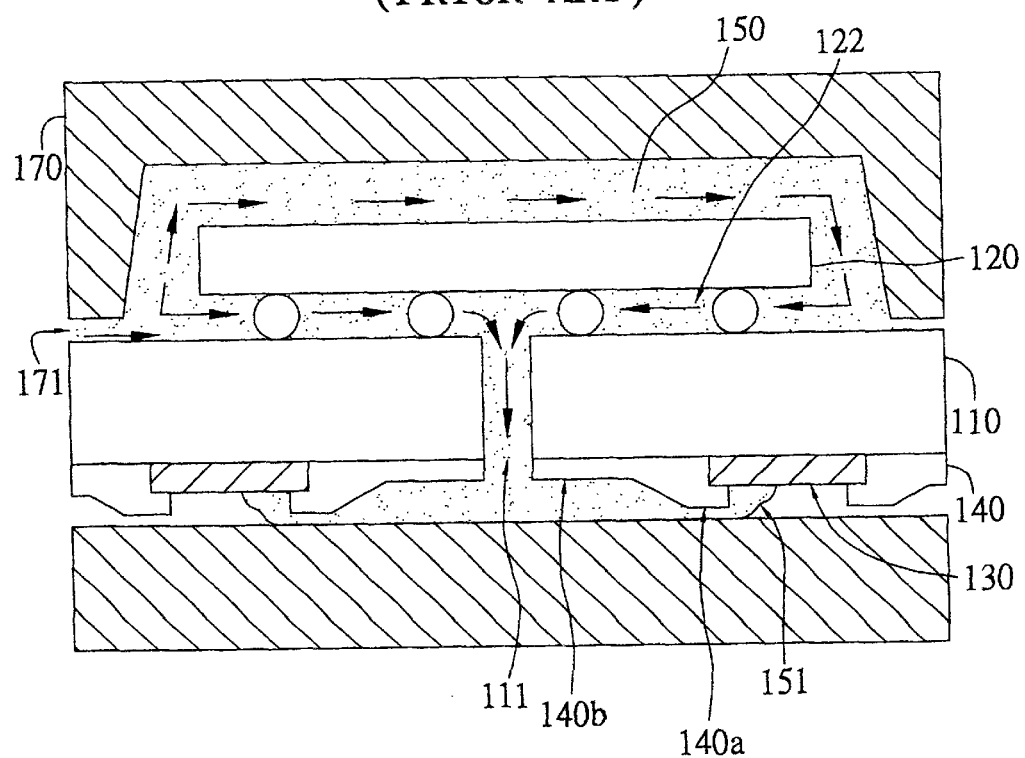
FIG. 1B (PRIOR ART) is a schematic sectional diagram showing the semi-finished FCBGA package assembly of FIG. 1A while undergoing a molding process.
Figure 1C:
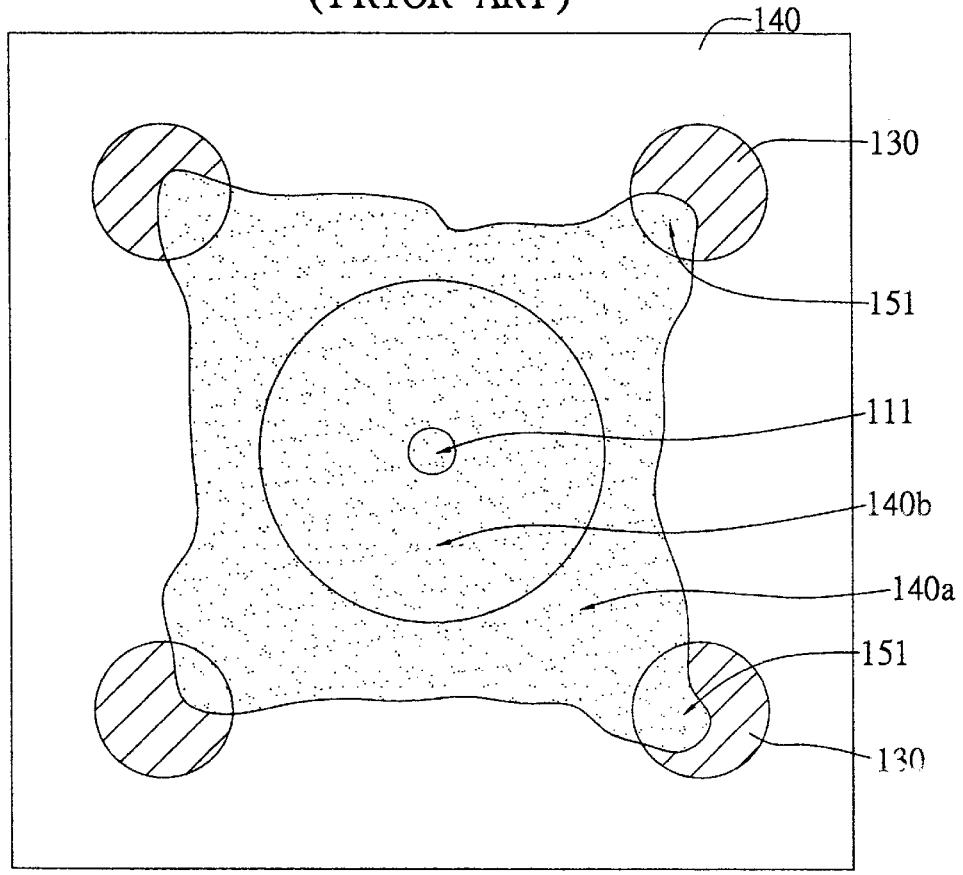
FIG. 1C (PRIOR ART) shows a bottom view of the FCBGA package assembly after molding.
Figure 1D:
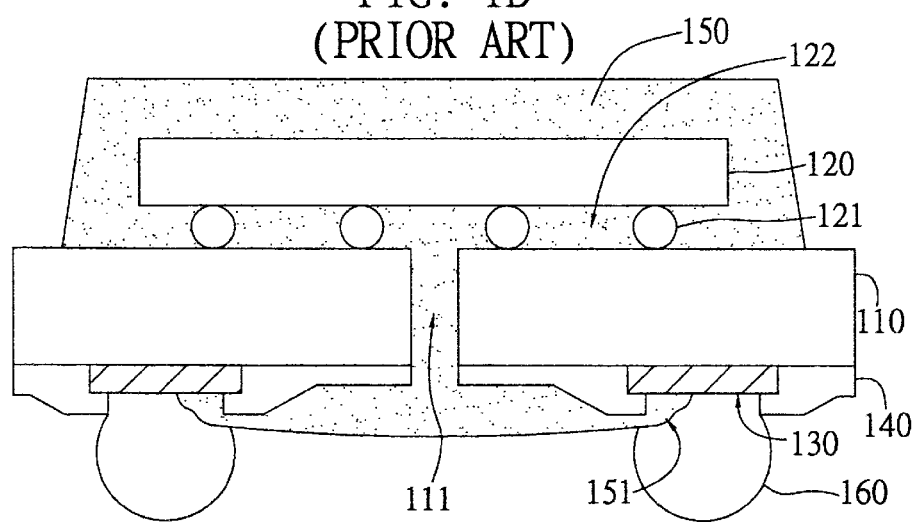
FIG. 1D (PRIOR ART) is a schematic sectional diagram showing the finished FCBGA package assembly after a ball grid array is attached.
Figure 2A:
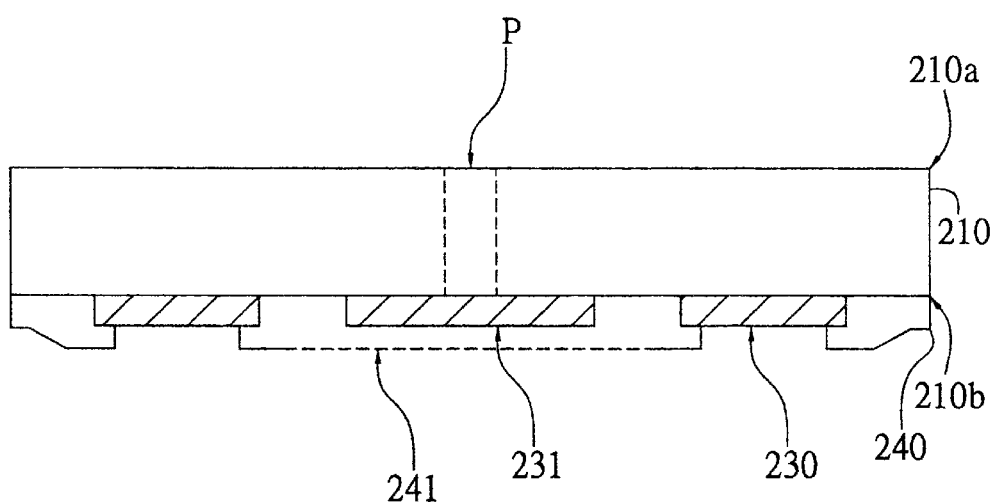
FIG. 2A is a schematic sectional diagram of a substrate on which the FCBGA package assembly configure according to the invention is constructed.

Referring first to FIG. 2A, the FCBGA package fabricated by the method according to the invention is constructed on a substrate 210 having a front surface 210*a* and a back surface 210*b*; wherein the back surface 210*b* is formed with an array of solder-ball pads 230.

It is a characteristic feature of the invention that a dummy pad 231 is formed on the back surface 210*b* of the substrate 210 at a predefined vent-hole position P. The dummy pad 231 can be fabricated together with the solder-ball pads 230 through the same metallization process, and which is dimensioned substantially equally in thickness as the solder-ball pads 230. Subsequently, a solder mask 240 is formed to cover all the areas of the back surface 210*b* of the substrate 210 including the dummy pad 231 while exposing the solder-ball pads 230.

During the foregoing solder-mask fabrication process, due to the existence of the dummy pad 231, the portion of the solder mask 240 that is laid over the dummy pad 231 would have an elevated flat surface 241 (rather than a recessed surface as in the case of the prior art) which is substantially leveled with the portion of the solder mask 240 that is laid over the rim of the solder-ball pads 230.

Figure 2B:
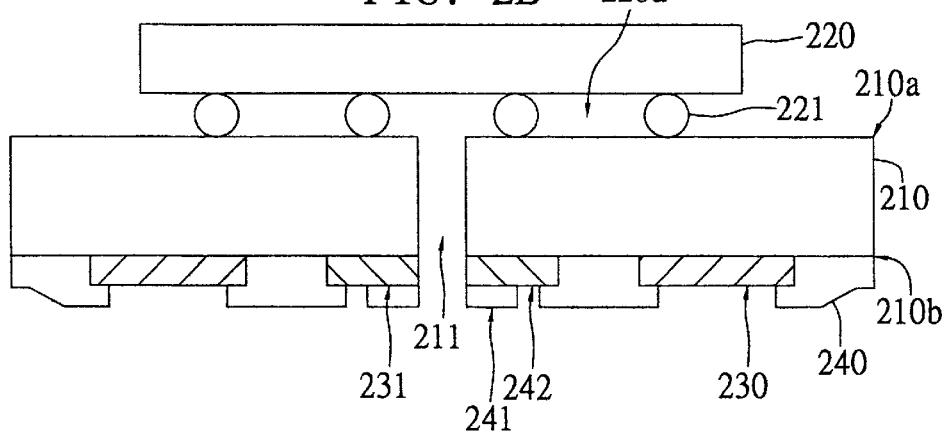
FIG. 2B is a schematic sectional diagram showing the semi-finished FCBGA package assembly configured according to the invention before molding.
Figure 2C:
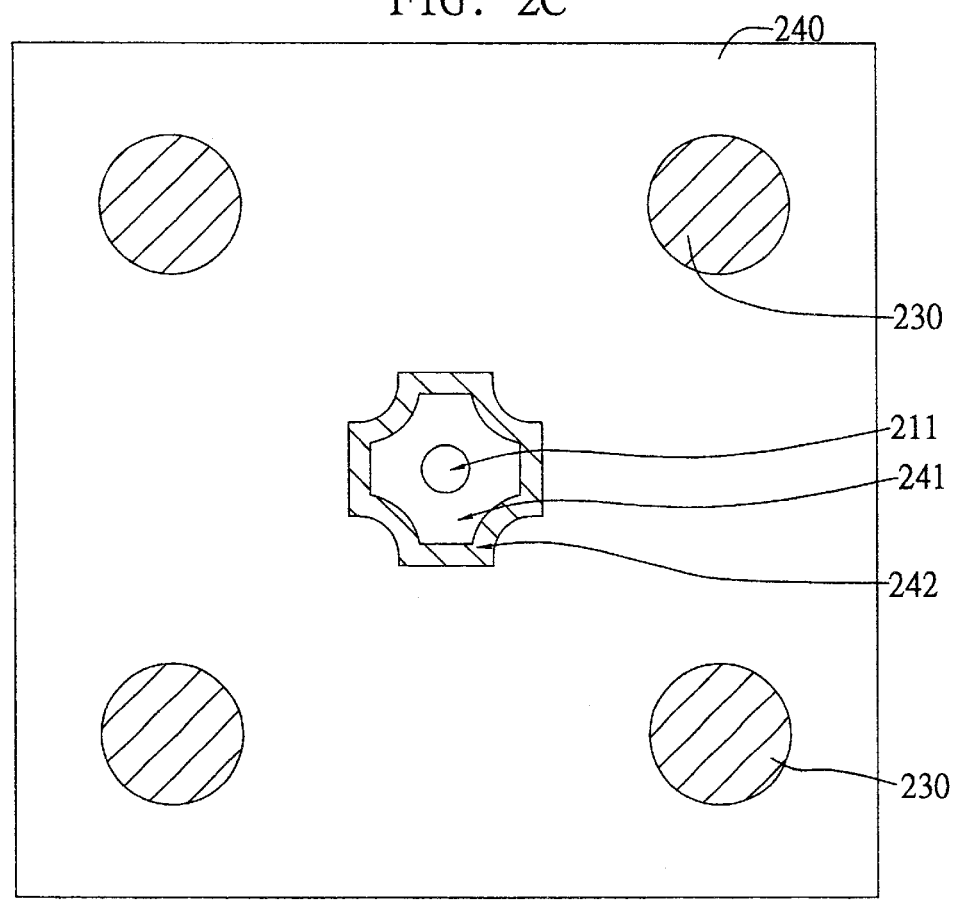
FIG. 2C shows a bottom view of the semi-finished FCBGA package assembly of FIG. 2B.

Referring further to FIG. 2B and FIG. 2C, in the next step, a vent hole 211 is formed by drilling through the predefined vent-hole position P, which penetrates successively through the substrate 210, the dummy pad 231, and the elevated flat surface 241 of the solder mask 240, resulting in an entrance in the front surface 210*a* of the substrate 210 and an exit in the elevated flat surface 241 of the solder mask 240. Subsequently, a groove 242 is formed by etching into the elevated flat surface 241 of the solder mask 240 surrounding the exit of the vent hole 211. Preferably, the groove 242 is shaped in such a manner that its sidewall is substantially oriented at 90 degrees with respect to the elevated flat surface 241 of the solder mask 240, as illustrated in FIG. 2B.

Referring further to FIG. 2D, in the next step, a molding process is performed by mounting the semi-finished FCBGA package assembly of FIG. 2B in a molding tool 270 having an injection inlet 271; and then, an encapsulation material, such as epoxy resin, is injected through the injection inlet 271 into the molding tool 270 to thereby form an encapsulation body 250 to encapsulate the semiconductor chip 220.

During the forgoing molding process, the encapsulation material will also infiltrate into the flip-chip undergap 220a. Owing to the provision of the vent hole 211, the air in the flip-chip undergap 220a can escape to the outside atmosphere, thus allowing the encapsulation material to infiltrate with air resistance into the entire flip-chip undergap 220a and thereby form a molded underfill layer 222 between the semiconductor chip 220 and the substrate 210.

As the encapsulation material further infiltrates through the vent hole 211 to the elevated flat surface 241 of the solder mask 240 (the marching path is indicated by the arrows in FIG. 2D), it would then infiltrate sideways through the seam between the molding tool 270 and the elevated flat surface 241 of the solder mask 240 to the groove 242. Within the groove 242, since the encapsulation material would be significantly slowed in flow speed and increased in viscosity after traveling a long way here, it would be contained within the groove 242 and hardly capable of further infiltrating to the nearby solder-ball pads 230. As a result, the solder-ball pads 230 can be prevented from mold flash.

As illustrated in FIG. 2E, as the molding process is completed, it can be seen that the encapsulation material would at furthest infiltrate to the groove 242, leaving the solder-ball pads 230 untouched; and as a result, no mold flash would exist over the solder-ball pads 230. Therefore, the resulted FCBGA package would be assured in the quality of its outer appearance.

Figure 2F:
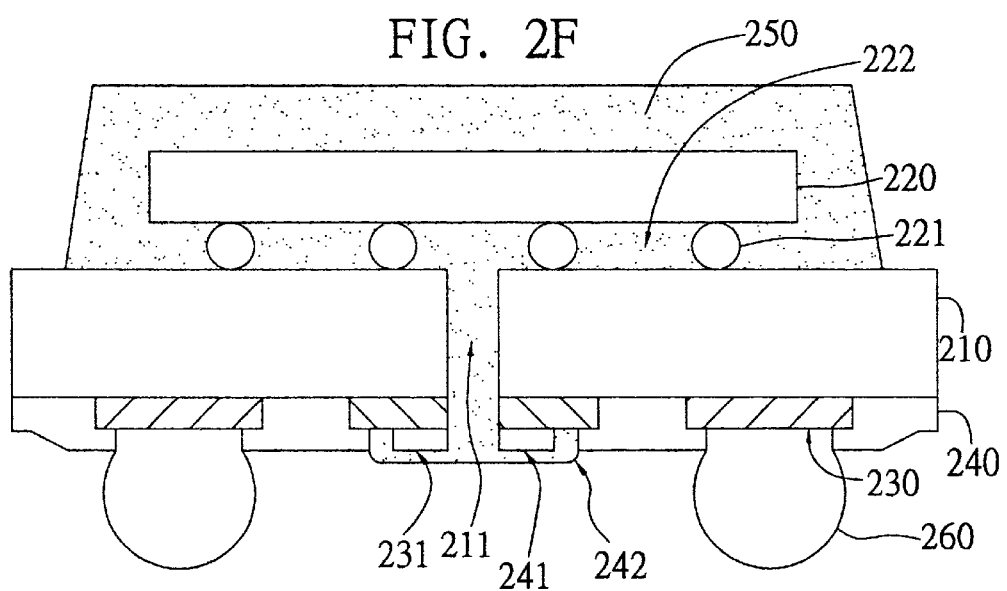
FIG. 2F is a schematic sectional diagram showing the finished FCBGA package assembly after a ball grid array is attached.

Referring further to FIG. 2F, in the next step, a ball grid array 260, i.e., an array of solder balls, are attached to the solder-ball pads 230. Since the invention allows no mold flash to be left over the solder-ball, pads 230, it can assure the quality of the electrical bonding between the solder-ball pads 230 and the ball grid array 260, thus making the encapsulated semiconductor chip 220 reliable to use during operation.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a FCBGA package, comprising the steps of:

(1) preparing a substrate having a front surface and a back surface, the substrate being predefined wit a vent-hole position at a specified location;

(2) forming a plurality of solder-ball pads and a dummy pad over the back surface of the substrate, the dummy pad being located at the predefined vent-hole position;

(3) forming a solder mask over the back surface of the substrate to cover all the back surface of the substrate including the dummy pad while exposing the solder-ball pads, wherein the solder mask has a portion laid over the dummy pad to be formed into an elevated flat surface, the elevated flat surface being level with an exposed surface of a portion of the solder mask covering the substrate exclusive of the dummy pad;

(4) drilling through the predefined vent-hole position to thereby form a vent hole having an entrance in the front surface of the substrate and an exit in the elevated flat surface of the solder mask;

(5) forming a groove in the elevated flat surface and surrounding the exit of the vent hole;

(6) mounting a flip chip over the front surface of the substrate, wherein a flip-chip undergap is left between the flip chip and the substrate; and (7) performing a molding process to form an encapsulation body through the use of an encapsulation material to encapsulate the flip chip;

wherein to vent hole allows air in die flip-chip undergap to escape to outside atmosphere, thereby allowing the encapsulation material to infiltrate with air resistance into the flip-chip undergap and form a molded-underfill layer;

and wherein as the encapsulation material flows to the exit of the vent hole and infiltrates to the groove, due to reduction in flow speed and increase in viscosity of the encapsulation material by traveling through the flip-chip undergap and the vent hole, the encapsulation material would be contained within the groove, thereby preventing the encapsulation material from flashing to the solder-ball pads.

2. The method of claim 1, wherein in said step (2), the dummy pad and the solder-ball pads are formed through a metallization process.

3. The method of claim 1, wherein in said step (2), the dummy pad is dimensioned substantially equally in thickness as the solder-ball pads.

4. The method of claim 1, wherein in said step (5), the groove is shaped in such a manner that its sidewall is substantially oriented at 90 degrees with respect to the elevated flat surface of the solder mask.

5. The method of claim 1, wherein in said step (5), the groove is formed by etching into the elevated flat surface of the solder mask.

6. The method of claim 1, wherein in said step (7), the encapsulation material is epoxy resin.

* * * * *